(12) United States Patent
Li et al.

(10) Patent No.: US 10,586,715 B2
(45) Date of Patent: Mar. 10, 2020

(54) EMBEDDED CIRCUIT PATTERNING FEATURE SELECTIVE ELECTROLESS

(71) Applicant: Intel Corporation, Santa Clara, CA (US)

(72) Inventors: Yonggang Yong Li, Chandler, AZ (US); Aritra Dhar, Tempe, AZ (US); Dilan Seneviratne, Chandler, AZ (US); Jon M. Williams, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 200 days.

(21) Appl. No.: 15/588,500

(22) Filed: May 5, 2017

(65) Prior Publication Data

US 2017/0243762 A1    Aug. 24, 2017

Related U.S. Application Data

(62) Division of application No. 14/229,777, filed on Mar. 28, 2014, now Pat. No. 9,646,854.

(51) Int. Cl.
*H01L 21/288* (2006.01)
*H01L 21/48* (2006.01)
(Continued)

(52) U.S. Cl.
CPC ...... *H01L 21/4857* (2013.01); *C23C 18/1608* (2013.01); *C23C 18/1612* (2013.01); *C23C 18/2086* (2013.01); *C23C 18/30* (2013.01); *C23C 18/38* (2013.01); *H01L 21/288* (2013.01); *H01L 21/486* (2013.01); *H01L 21/4864* (2013.01); *H01L 23/49822* (2013.01); *H01L 23/49827* (2013.01); *H01L 23/49838* (2013.01); *H01L 23/49866* (2013.01); *H05K 3/107* (2013.01); *H05K 3/185* (2013.01);
(Continued)

(58) Field of Classification Search
CPC ................................. H01L 21/76874
See application file for complete search history.

(56) References Cited

U.S. PATENT DOCUMENTS 6,803,318 B1 * 10/2004 Qiao ................ H01L 21/31116
257/E21.252
2004/0170699 A1 * 9/2004 Chane-Ching ......... A61K 6/033
424/602
(Continued)

*Primary Examiner* — Moazzam Hossain
(74) *Attorney, Agent, or Firm* — Schwabe, Williamson & Wyatt, P.C.

(57) ABSTRACT

Embodiments describe the selective electroless plating of dielectric layers. According to an embodiment, a dielectric layer is patterned to form one or more patterned surfaces. A seed layer is then selectively formed along the patterned surfaces of the dielectric layer. An electroless plating process is used to deposit metal only on the patterned surfaces of the dielectric layer. According to an embodiment, the dielectric layer is doped with an activator precursor. Laser assisted local activation is performed on the patterned surfaces of the dielectric layer in order to selectively form a seed layer only on the patterned surfaces of the dielectric layer by reducing the activator precursor to an oxidation state of zero. According to an additional embodiment, a seed layer is selectively formed on the patterned surfaces of the dielectric layer with a colloidal or ionic seeding solution.

11 Claims, 6 Drawing Sheets

(51) Int. Cl.
  *H01L 23/498* (2006.01)
  *C23C 18/16* (2006.01)
  *C23C 18/38* (2006.01)
  *C23C 18/20* (2006.01)
  *C23C 18/30* (2006.01)
  *H05K 3/10* (2006.01)
  *H05K 3/18* (2006.01)
  *H05K 3/00* (2006.01)
  *H05K 3/04* (2006.01)
  *H01L 23/00* (2006.01)

(52) U.S. Cl.
  CPC .... *H01L 24/17* (2013.01); *H01L 2224/16225* (2013.01); *H01L 2924/15311* (2013.01); *H05K 3/0032* (2013.01); *H05K 3/045* (2013.01); *H05K 2201/0236* (2013.01); *H05K 2203/072* (2013.01); *H05K 2203/107* (2013.01)

(56) References Cited

U.S. PATENT DOCUMENTS

| | | | |
|---|---|---|---|
| 2007/0163887 A1* | 7/2007 | Hofmann | H05K 3/465 |
| | | | 205/80 |
| 2008/0032301 A1* | 2/2008 | Rank | B01J 19/0046 |
| | | | 435/6.11 |
| 2014/0028518 A1* | 1/2014 | Arnold | H01Q 1/526 |
| | | | 343/841 |
| 2014/0120255 A1* | 5/2014 | Lee | C23C 18/30 |
| | | | 427/214 |
| 2016/0009552 A1* | 1/2016 | Ressier | B81C 1/00373 |
| | | | 307/400 |

* cited by examiner

EMBEDDED CIRCUIT PATTERNING FEATURE SELECTIVE ELECTROLESS

CROSS-REFERENCE TO RELATED APPLICATIONS

This application is a divisional of and claims the benefit of U.S. patent application Ser. No. 14/229,777, titled "Embedded Circuit Patterning Feature Selective Electroless Copper Plating", filed Mar. 28, 2014, which is presently pending, the entire contents of which is hereby incorporated by reference in its entirety for all purposes.

FIELD OF THE INVENTION

Embodiments of the present invention relate generally to the manufacture of semiconductor devices. In particular, embodiments of the present invention relate to selective electroless plating of dielectric layers.

BACKGROUND AND RELATED ARTS

High density interconnection (HDI) substrate patterning is typically performed with semi-additive patterning (SAP). SAP requires eight processing steps to form each dielectric layer. First, a dielectric material is formed over an existing layer. Vias are then etched through the dielectric layer to provide electrical connections to the lower layer. A seed layer is then deposited onto all exposed surfaces. In order to prevent metal deposition across the entire surface, a resist layer is formed over the exposed surfaces and then patterned. The patterning exposes only regions of the dielectric layer on which metal is desired in order to form contact lines and contact vias. Electroless plating then metalizes the exposed surfaces of the dielectric layer. The resist layer may then be removed. Finally, the seed layer that was formed over the regions that were not metallized is removed.

DETAILED DESCRIPTION

Figure 1A:
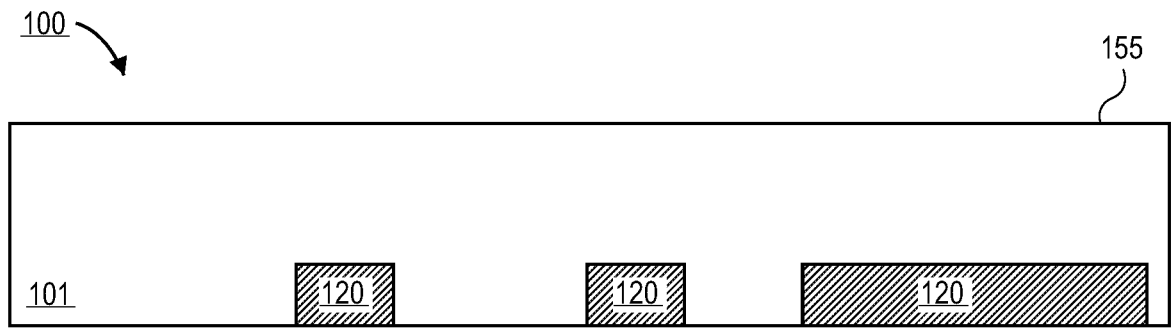
FIGS. 1A-1D illustrate cross-sectional views of a process for selectively metallizing a dielectric layer having a seed layer formed with a laser assisted local activation process according to an embodiment.

Embodiments are directed to the selective electroless plating of dielectric layers. According to an embodiment, a dielectric layer is patterned to form one or more patterned surfaces. A seed layer is then selectively formed along the patterned surfaces of the dielectric layer. An electroless plating process is used to deposit metal only on the patterned surfaces of the dielectric layer.

According to an embodiment, the dielectric layer is doped with an activator precursor. Laser assisted local activation is performed on the patterned surfaces of the dielectric layer in order to selectively form a seed layer only on the patterned surfaces of the dielectric layer. According to an embodiment, after the seed layer has been formed, the dielectric layer is metallized with an electroless plating process.

According to an embodiment, the seed layer is selectively formed over the patterned surfaces of the dielectric layer by increasing the surface potential of the patterned surfaces relative to the unpatterned surfaces. In an embodiment, the surface potential of the patterned surfaces may be increased by patterning the dielectric layer with a laser ablation process. The laser ablation process increases the surface potential by producing photolytic bond fissures, producing static charge, and increasing the surface roughness of the dielectric layer. According to an embodiment, the surface potential of the patterned surfaces may be further increased by applying a surface treatment to the dielectric layer prior to forming the seed layer.

According to an embodiment, a seeding solution used to deposit the seed layer onto the patterned surfaces is a colloidal seeding solution. For example, the colloidal seeding solution may include a mixture of $PdSO_4$ and $H_2SO_4$. Such a seeding solution produces negatively charged Pd colloids that are deposited out of the solution to form the seed layer. In such embodiments, the dielectric layer may be dipped into the colloidal seeding solution after a surfactant has been applied to the surface of the dielectric layer. Alternative embodiments include dipping the dielectric layer into the colloidal solution first, and then applying a surfactant to the surface of the dielectric layer. According to an embodiment, a reducing agent may also be applied to the surface of the dielectric layer in order to reduce the deposited Pd colloids that form the seed layer to an oxidation state of zero. According to an embodiment, a colloidal seeding solution may also include a mixture of $SnCl_2$ and $PdCl_2$. In such embodiments, negatively charged colloids comprising Pd and Cl ions are formed. In such embodiments, excess Sn ions readily reduce the Pd ions to an oxidation state of zero, and therefore, the application of a reducing agent to the surface of the dielectric layer is not required.

According to an embodiment, a seeding solution used to deposit the seed layer onto the patterned surfaces is an ionic solution. According to an embodiment, an ionic seeding solution may include a $PdCl_2$ and HCl solution. In such embodiments, a reducing agent is applied to the seed layer in order to reduce the deposited Pd ions that form the seed layer to an oxidation state of zero.

In an additional embodiment, the seed layer may be formed over the entire surface of the dielectric layer including patterned and unpatterned surfaces. In such embodiments, the adhesion strength of the seed layer formed over unpatterned surfaces is weaker than the adhesion strength of the seed layer formed over the patterned surfaces. In such embodiments, the seed layer formed over unpatterned surfaces is removed with a cleaning process, such as ultra-sonic cleaning, washing with a high pressure water jet, or a combination of the two. According to an embodiment, the dielectric layer may be metalized with an electroless plating process while the seed layer is still covering unpatterned surfaces of the dielectric layer. In such embodiments, a cleaning process performed subsequent to the electroless plating process will remove the material plated over the unpatterned surfaces because the adhesion strength of the unpatterned surfaces is lower than the adhesion strength of the patterned surfaces.

FIGS. 1A-1D are cross sectional views of a dielectric layer that is patterned and metalized with an electroless process according to an embodiment that includes a dielectric layer that is doped with an activator precursor. Laser assisted local activation of the patterned surfaces selectively produces a seed layer on the patterned surfaces. After the seed layer has been formed, the dielectric layer is metallized with an electroless deposition process to selectively form metal connections on the patterned surfaces of the dielectric layer.

Referring now to FIG. 1A, a cross section of a build-up structure 100 is shown. The build-up structure 100 includes a dielectric layer 101 formed over several electrical contacts 120. Electrical contacts 120 may provide electrical connections to a lower dielectric layer formed in the build-up structure 100. In an embodiment, dielectric layer 101 may be the first layer of a build-up structure, and therefore, certain embodiments do not include forming the dielectric layer over existing contacts 120. In an embodiment, the dielectric layer 101 is formed over a build-up structure core layer. According to an embodiment, the dielectric layer 101 may be an organic or inorganic material. By way of example, and not by way of limitation, the dielectric layer 101 may be a polyimide or an epoxy material. According to an embodiment, the dielectric layer 101 may be a resin based material. In an embodiment, dielectric layer 101 is laminated over an existing layer. In alternative embodiments, the dielectric layer 101 may be a liquid based material, and may be spun on over the surface of an existing layer. Embodiments include cured and partially cured dielectric layers 101. By way of example, and not by way of limitation, a partially cured dielectric layer 101 may be approximately 90% cross-linked or greater. As shown in FIG. 1A, dielectric layer 101 has a top unpatterned surface 155.

According to an embodiment, the dielectric layer 101 may be doped with an activator precursor material that is evenly dispersed through the dielectric layer 101. The precursor material may be mixed into the dielectric material while the dielectric material is in a liquid phase prior to being deposited onto the build-up structure 100. According to an embodiment, the doping concentration of the activator precursor may be approximately 1% (by weight) or less. In embodiments, the activator precursor material is a material that includes a metallic compound that is capable of being reduced to form a seed layer on surfaces of the dielectric layer 101. As used herein, a seed layer is a metallic layer that functions as a catalyst for a chemical reduction of a metal that will be plated onto the surface of the dielectric layer 101 with an electroless plating process. By way of example, and not by way of limitation, the activator precursor material may be $PdCl_2$, $PdSO_4$, $Pd(acac)_2$, $AgCl_2$, or $RuCl_2$, Pd nano-particles, Ag nano-particles, or Cu nano-particles.

Figure 1B:
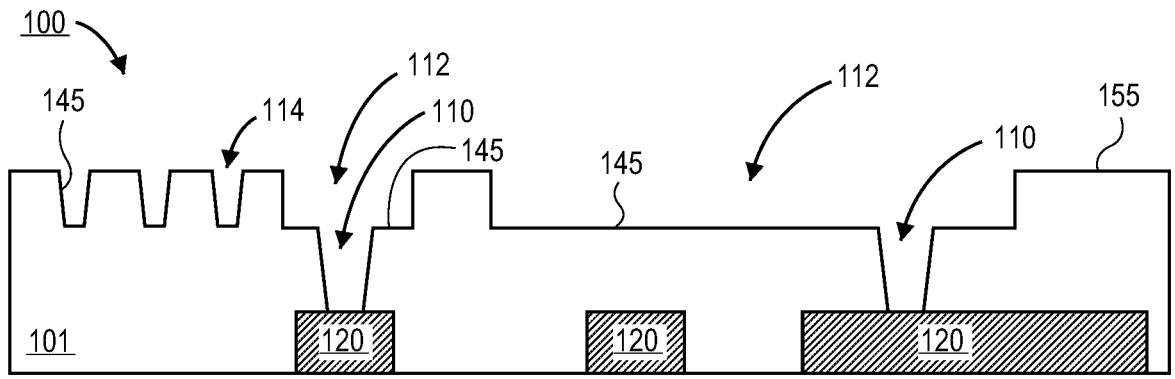

Referring now to FIG. 1B, the top unpatterned surface 155 of the dielectric layer 101 is patterned with a patterning process to form patterned surfaces 145 in the dielectric layer 101. According to an embodiment, the pattern may comprise one or more contact via openings 110 that provide an opening through dielectric layer 101 to electrical contacts 120 formed on a lower layer, one or more contact openings 112, and one or more line openings 114, or any combination thereof. According to embodiments, the pattern may be formed with a patterning process such as direct laser writing, laser projection patterning, plasma etching, or other known patterning processes.

In an embodiment, the via openings 110 may be formed with a first patterning process, and the contact openings 112 and the contact line openings 114 may be formed with a second patterning process. The first patterning process used to form the via openings 110 may be a different patterning process than the second patterning process. By way of example, and not by way of limitation, the first patterning process may include laser ablation, and the second patterning process may include a plasma etching process. Additional embodiments include first and second patterning processes that are the same process. For example, both the first and second patterning processes may include a laser ablation process. According to such an embodiment, the laser intensity may be the same for the first and second patterning processes. Alternatively, the first and second patterning processes may use different laser intensities. By way of example, and not by way of limitation, the intensity of a laser for a direct laser writing process may be between 0.5 J/cm$^2$ and 3 J/cm$^2$. In an additional embodiment, the via openings 110, the contact openings 112, and the line openings 114 may be formed with a single patterning process.

Figure 1C:
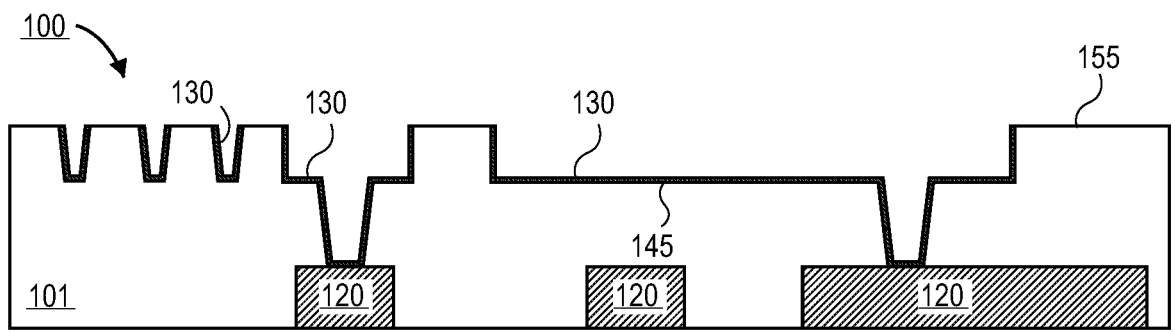

Referring now to FIG. 1C, a seed layer 130 is formed over the patterned surfaces 145 with a laser assisted local activation process. Using laser assisted local activation to produce the seed layer allows for the seed layer 130 to be selectively formed only on the patterned surfaces 145 of the dielectric layer 101. Laser assisted local activation of the patterned surfaces 145 reduces the metallic component of the activator precursor present in the dielectric layer 101. By way of example, the activator precursor is reduced to an oxidation state of zero by removing the ligands from the metallic element. An example of the reduction of the metal component in the activator precursor is provided in Equation 1 which shows the reduction of $PdCl_2$ to $Pd^{(0)}$.

$$PdCl_2 \rightarrow Pd^{(0)} + Cl_2 \quad \text{(Equation 1)}$$

In an embodiment, the intensity of the laser during laser assisted local activation is chosen based on the bond energy of the compound used for the activator precursor. For example, a lower intensity is needed in organometallic precursors, such as $Pd(acac)_2$, because of the lower bond energy between palladium and carbon compared to the bond energy, for example, between palladium and chlorine. In embodiments the intensity of the laser during laser assisted local activation is lower than the laser intensity needed to ablate the dielectric layer 101. By way of example, and not by way of limitation, an intensity of approximately 0.5 J/cm$^2$ or lower is needed to reduce the metallic component to an oxidation state of zero.

While the seed layer is shown as a continuous layer in FIG. 1C, embodiments are not limited to such configurations. It is noted that the seed layer 130 does not need to be continuous in order to allow for subsequent metallization with an electroless plating process. As such, a seed layer 130 may include isolated metallic elements dispersed over the patterned surfaces 145. According to embodiments, the seed layer may have a thickness less than 10 Å. By way of example, and not by way of limitation, the seed layer may have a thickness equal to the thickness of a single atom of the metallic component.

According to an embodiment, the laser assisted local activation is performed during the patterning process. For example, when the dielectric layer 101 is patterned with laser ablation, laser assisted local activation may be performed simultaneously with the patterning process. Additional embodiments include laser assisted local activation that is performed after the patterning process. For example, a plasma etching process may be used to form the pattern, and thereafter, the laser assisted local activation may be performed to form the seed layer 130. An additional embodiment may also include laser ablating the dielectric layer 101 to form the pattern with a first laser, and then using the first laser in a second pass to perform the localized activation of the patterned surfaces 145. In an embodiment, the laser ablation may be performed with a first laser and a second laser may follow the first laser and perform the localized activation of the patterned surfaces 145.

Figure 1D:
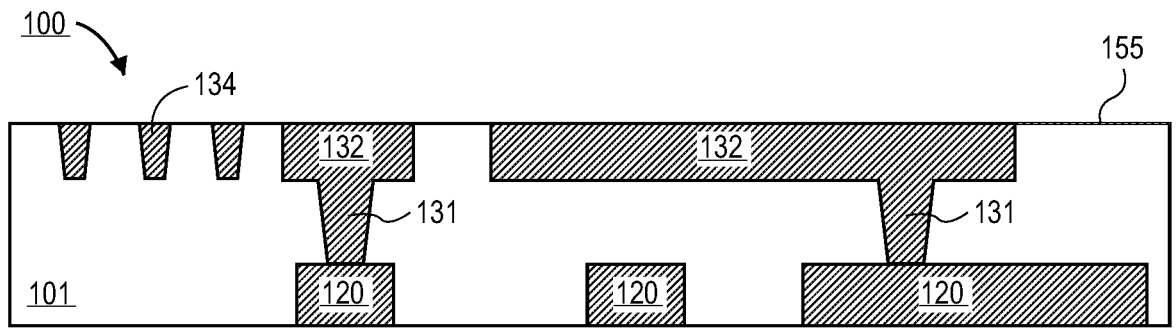

Referring now to FIG. 1D, the dielectric layer 101 is metallized with an electroless plating process. Since the seed layer 130 is selectively formed only along the patterned surfaces, metal is only deposited on those surfaces. Embodiments include electroless plating processes for depositing copper. As shown, the electroless plating process deposits metal into vias 110, contact openings 112, and line openings 114 to form conductive vias 131, contacts 132, and lines 134, respectively. In an embodiment, the bath used for the electroless plating process may be a solution comprising a source of metal ions, and a reducing agent. By way of example, and not by way of limitation, the metal ions may be copper ions. In an embodiment, the reducing agent may be formaldehyde or dimethylamine borane (DMAB). According to embodiments, the electroless plating solution may also comprise complexants, buffers, stabilizers, and/or accelerators, as is known in the art.

A catalyst is needed for reducing the metal ions. As such, when the dielectric layer 101 having a seed layer 130 formed thereon is introduced into the bath a chemical reduction of metal occurs only on the portions of the dielectric layer 101 where the seed layer 130 is present. An exemplary chemical reaction for electroless plating of copper is shown in Equation 2.

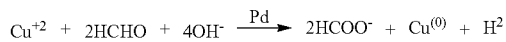

(Equation 2)

$$Cu^{+2} + 2HCHO + 4OH^- \xrightarrow{Pd} 2HCOO^- + Cu^{(0)} + H_2$$

Accordingly, the electroless plating process described with respect to FIGS. 1A-1D may be used to selectively plate only the patterned surfaces of a dielectric layer. As shown in FIG. 1D, the top surfaces of the contacts 132 and lines 134 may be substantially coplanar with the top of the unpatterned surfaces 155 of the dielectric layer 101.

According to an additional embodiment, differences in the surface potential of patterned surfaces 145 and unpatterned surfaces 155 are used in order to selectively metalize only the patterned surfaces 145. In such embodiments, the dielectric layer is dipped into a seeding solution and the seed layer deposits from the solution onto the dielectric layer. According to embodiments, the seeding solution may be a colloidal seeding solution or an ionic seeding solution.

Figure 2A:
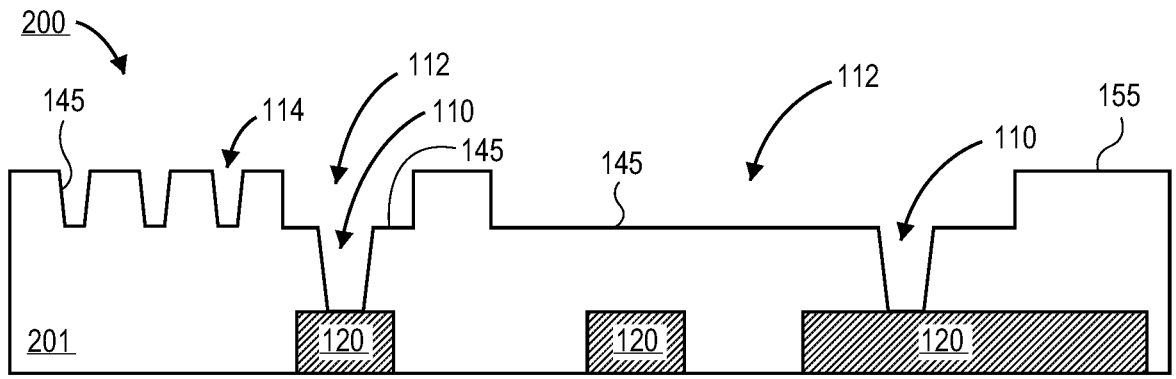
FIGS. 2A-2B illustrate cross-sectional views of a process for selectively metallizing a dielectric layer having a seed layer formed with a colloidal seeding solution according to an embodiment.
Figure 2B:
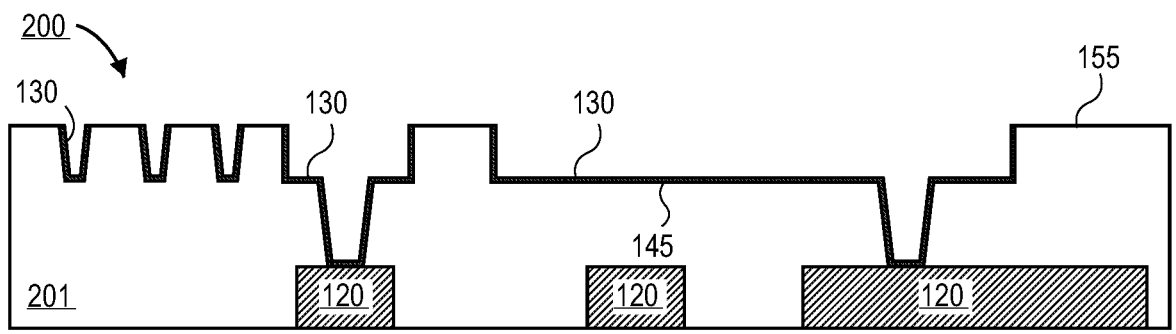

Referring now to FIGS. 2A-2B, a process of forming the seed layer 130 with a colloidal solution is described according to an embodiment. As shown in FIG. 2A, a dielectric layer 201 is formed and patterned. As shown, the dielectric layer 201 may be formed over one or more contacts 120 formed on a lower layer. Dielectric layer 201 is substantially similar to the dielectric layer described above with respect to FIG. 1A, with the exception that it does not need to be doped with an activator precursor. Dielectric layer 201 may be spun on or laminated over an existing layer. Embodiments include a cured or partially cured dielectric layer 201. By way of example, and not by way of limitation, a partially cured dielectric layer 201 may be 90% cured. As shown in FIG. 2A, the patterned dielectric layer 201 may comprise one or more via openings 110 that provide an opening to electrical contacts 120 formed on a lower layer, one or more contact pad openings 112, and one or more contact line openings 114, or any combination thereof.

According to embodiments, the patterning process used to pattern the dielectric layer 130 increases the surface potential of the patterned surfaces 145 with respect to the surface potential of the unpatterned surfaces 155. According to an embodiment, the patterning process is a laser ablation process. The use of laser ablation provides several mechanisms for increasing the surface potential of the patterned surfaces 145. For example, photolytic decomposition of the dielectric material in the dielectric layer 201 changes the surface functionalities (e.g., chemical reactivity and/or electrical conductivity) by producing dangling bonds at the laser ablated surface. Since ligands have been removed from the dielectric material, the ablated surface is more reactive and will have an increased surface potential. The surface potential of the laser ablated surfaces depends on the conformational orientation of the functional groups and presences of ionic and/or radical fragments that are left at the surface. By way of example, and not by way of limitation, the exposed functional groups may include C=O groups, C—O ester groups, C=N groups, C—H groups from aromatic and aliphatic components, and COOH groups. Additionally, friction caused during laser ablation produces static charge on the patterned surfaces 145 that also increases the surface potential of the patterned surfaces 145 relative to the unpatterned surfaces 155.

According to an embodiment, the surface potential of the patterned surfaces 145 relative to the unpatterned surfaces 155 may be increased further by applying a surface treatment to the dielectric layer 201. The increase in surface potential results from the removal of loose debris from the laser ablation process, thereby exposing additional dangling bonds on the patterned surface. According to embodiments, the surface treatment includes the application of one or more of deionized water, ethanol, acetone, $H_2SO_4$, $H_2NO_3$, or Na-dodecylbenzene sulfonate (SDBS). In an embodiment, the surface treatment may include rinsing the solution over the surface of the dielectric layer 201. Alternatively, the surface treatment may include dipping the dielectric layer 201 into a bath of the surface treatment solution. In an embodiment, the surface potential of the patterned surfaces 145 may be increased by between 100% and 500% after the surface treatment. By way of example, and not by way of limitation, before a surface treatment, the patterned surfaces 145 may have a surface potential between approximately 1 V and 2 V (as measured by an electrostatic voltmeter) and the surface potential of the patterned surfaces 145 may be between approximately 4 V and 10 V (as measured by an electrostatic voltmeter) after the surface treatment. In an embodiment that includes applying a deionized water surface treatment to the surfaces of the dielectric layer 201, the surface potential of the unpatterned surfaces 155 of the dielectric layer 201 may be approximately −1 V (as measured by an electrostatic voltmeter) and the surface potential of patterned surfaces 145 of the dielectric layer 201 may be approximately 10 V (as measured by an electrostatic voltmeter).

After dielectric layer 201 has been patterned and a surface treatment has (optionally) been applied, a seed layer is formed over the surface of the dielectric layer 201. According to embodiments, the seed layer 130 is selectively formed over the patterned surfaces 145, as shown in FIG. 2B, by dipping the dielectric layer 201 into a seeding solution. The increased surface potential of the patterned surfaces 145 causes the seed layer 130 to selectively deposit over the patterned surfaces 145 of the dielectric layer 201.

According to an embodiment, a colloidal seeding solution may include a solution including $PdSO_4$ and $H_2SO_4$. A seeding solution that includes $PdSO_4$ and $H_2SO_4$ results in the formation of negatively charged Pd colloids. By way of example, the Pd colloids may have an average diameter between approximately 4 nm and 8 nm. Since the charge of the Pd colloids is opposite to that of the patterned surface 145, the Pd colloids selectively deposit onto the positively charged patterned surfaces 145. Embodiments may also include the application of a surfactant. By way of example, and not by way of limitation, the surfactant may be SDBS or polyvinyl pyrrolidone (PVP). A surfactant may decrease the surface tension and improve the coating of the seed layer 130 onto the patterned surfaces 145. According to an embodiment, the surfactant may be applied to the dielectric layer 201 before or after the $PdSO_4/H_2SO_4$ seeding solution has been applied. The deposited Pd colloids that form the seed layer 130 are capable of catalyzing the electroless plating process even though the Pd is not reduced to an oxidation state of zero. According to an additional embodiment, the Pd colloids may be may be reduced to an oxidation state of zero (i.e., $Pd^{(0)}$) in order to provide a greater catalyzing effect during the electroless plating process. The Pd colloids may be reduced to $Pd^{(0)}$ by applying a reducing agent to the surfaces of the dielectric layer 201 subsequent to the formation of the seed layer 130. By way of example, and not by way of limitation, the reducing agent may be DMAB trimethylamine borane, isopropylamineborane, morpholineborane, sodium borohydride, potassium borohydride, or hypophosphorus acid.

According to an additional embodiment, a colloidal seeding solution includes a mixture of $SnCl_2$ and $PdCl_2$. The solution of $SnCl_2$ and $PdCl_2$ produces a negatively charged colloid that includes Pd and Sn ions. In an embodiment, the Pd/Sn colloids may have an average diameter between 10 nm and 20 nm. The negatively charged colloid selectively deposits on the positively charged patterned surfaces 145.

Furthermore, $Sn^{+2}$ ions readily reduce $Pd^{+2}$ ions. As such the Pd colloids may also be reduced to an oxidation state of zero by excess $Sn^{+2}$ ions in the solution. Accordingly, there is no need to apply a reducing agent to the dielectric layer 201 after the seed layer 130 has been deposited onto the surfaces of the dielectric layer 201.

While the seed layer 130 is shown as a continuous layer in FIG. 2B, embodiments are not limited to such configurations. It is noted that the seed layer 130 does not need to be continuous in order to allow for subsequent metallization with an electroless plating process. As such, a seed layer 130 may include isolated metallic elements or colloids dispersed over the patterned surfaces 145. According to embodiments, the seed layer may have a thickness less than 10 Å. By way of example, and not by way of limitation, the seed layer may have a thickness equal to the thickness of a single atom of the metallic component.

Subsequent to forming the seed layer 130, the dielectric layer 201 is metallized with an electroless plating process. Since the seed layer 130 is selectively formed only along the patterned surfaces, metal is only disposed in these areas. Accordingly, additional masking layers that are needed in traditional SAP processes to shield the seed layer 130 from unpatterned surfaces 155 are not needed according to embodiments. Embodiments include electroless plating processes for depositing copper. The electroless plating process deposits metal into vias 110, contact openings 112, and line openings 114 to form conductive vias 131, contacts 132, and lines 134, respectively. As such, a metallized dielectric layer 201 that is substantially similar to the metallized dielectric layer 101 illustrated in FIG. 1D is formed. In an embodiment, the bath used for the electroless plating process may be a solution comprising a source of metal ions, and a reducing agent. For example, the metal ions may be copper ions. In an embodiment, the reducing agent may be formaldehyde or DMAB. According to embodiments, the electroless plating solution may also comprise complexants, buffers, stabilizers, and/or accelerators, as is known in the art.

Figure 3:
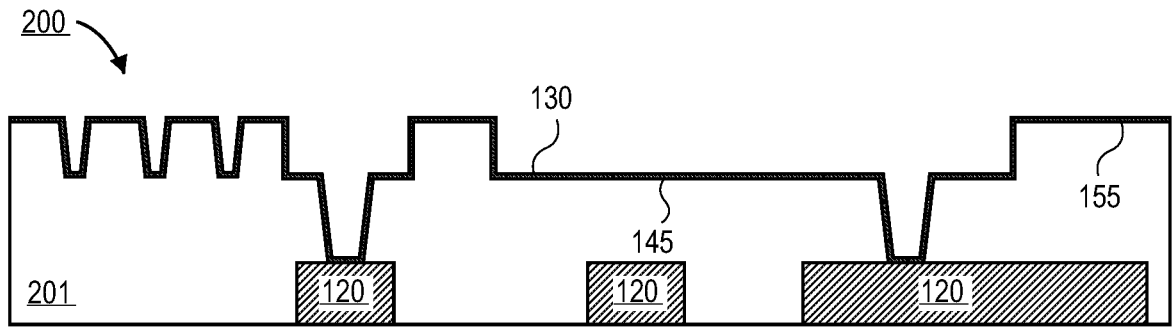
FIG. 3 illustrates a cross-sectional view of a process for selectively metallizing a dielectric layer having a seed layer formed with a colloidal seeding solution according to an embodiment.

According to an additional embodiment, the use of a seeding solution including colloids to form the seed layer 130 may not be entirely selective to the patterned surfaces 145 of the dielectric layer 201, as shown in FIG. 3. For example, the unpatterned surfaces 155 may also have a slightly positive surface potential. As such, negatively charged colloids may be deposited over the patterned surfaces 145 and the unpatterned surfaces 155 of the dielectric layer 201. In such embodiments, portions of the seed layer 130 that are formed on unpatterned surfaces 155 may be removed with a cleaning process prior to electroless deposition. According to embodiments, the seed layer 130 is able to be selectively removed from the unpatterned surfaces 155 because the adhesion between the unpatterned surfaces 155 and the seed layer 130 is weaker than the adhesion between the pattern surfaces 145 and the seed layer 130. By way of example, and not by way of limitation, the adhesion strength between the unpatterned surfaces 155 and the seed layer 130 may be weaker because the unpatterned surfaces 155 have a lower surface potential and/or because the unpatterned surfaces provides weaker mechanical anchoring for the seed layer 130.

In certain patterning processes, such as, for example, those that utilize laser ablation or plasma etching, the patterning process may increase the surface roughness of the patterned surfaces. By way of example, a laminated dielectric layer that has been partially cured has a surface roughness (Ra) of approximately 60 nm or less, and the surface roughness (Ra) of a laser ablated surface is approximately 200 nm or greater. The increase in surface roughness of the patterned surfaces 145 improves the mechanical anchoring of the seed layer 130 to the patterned surfaces 145 of the dielectric layer 201.

Accordingly, a surface cleaning process may be used to selectively remove the seed layer from the unpatterned surfaces. After removing the seed layer 130 from the unpatterned surfaces 155, the dielectric layer 201 is selectively plated with an electroless plating process substantially similar to those described above. Accordingly, a metallized dielectric layer 201 is formed that is substantially similar to the dielectric layer 101 illustrated in FIG. 1D. In an embodiment, the cleaning process may include ultra-sonic cleaning, washing with a high pressure water jet, or a combination of the two. Additional embodiments may include a cleaning process that includes washing the surface with one or more of acetone, NaOH, and $HNO_3$. In an embodiment, the cleaning process may be performed after the electroless plating. In such embodiments, the entire surface of the dielectric layer 101 may metalized. However, as a result of the weaker adhesion between the seed layer 130 and the unpatterned surfaces 155, the cleaning process will selectively remove the deposited metal formed over the unpatterned surfaces 155 of the dielectric layer 201.

Figure 4A:
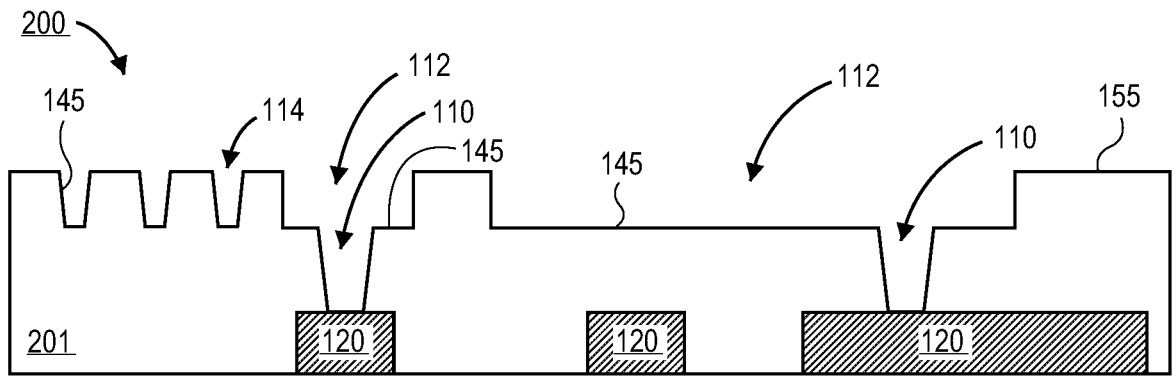
FIGS. 4A-4D illustrate cross-sectional views of a process for selectively metallizing a dielectric layer having a seed layer formed with an ionic seeding solution according to an embodiment.

Referring now to FIGS. 4A-4D, a process of forming the seed layer 130 with an ionic seeding solution is described according to an embodiment. As shown in FIG. 4A, a dielectric layer 201 is formed and patterned. As shown, the dielectric layer 201 may be formed over one or more contacts 120 formed on a lower layer. Dielectric layer 201 is substantially similar to the dielectric layer described above with respect to FIG. 2A. Dielectric layer 201 may be spun on or laminated. Embodiments include a cured or partially cured dielectric layer 201. By way of example, a partially cured dielectric layer 201 may be 90% cured. As shown in FIG. 4A, the patterned dielectric layer 201 may comprise one or more via openings 110 that provide an opening to electrical contacts 120 formed on a lower dielectric layer, one or more contact pad openings 112, and one or more contact line openings 114, or any combination thereof.

According to embodiments, the patterning process used to pattern the dielectric layer 130 increases the surface potential of the patterned surfaces 145 with respect to the surface potential of the unpatterned surfaces 155. According to an embodiment, the patterning process is a laser ablation process. The use of laser ablation provides several mechanisms for increasing the surface potential of the patterned surfaces. For example, laser ablation may increase the surface potential and the reactivity of the surface as a result of photolytic decomposition. Additionally, friction caused during laser ablation produces static charge on the patterned surfaces 145 that also increases the surface potential of the patterned surfaces 145 relative to the unpatterned surfaces 155. Furthermore, certain patterning processes, such as laser ablation or plasma etching, may also increase the surface roughness of the patterned surfaces relative to the unpatterned surfaces. In such embodiments, additional mechanical anchoring is provided to portions of the seed layer 130 formed on the patterned surfaces 145, thereby allowing for cleaning processes to be used to selectively remove portions of the seed layer 130 from the unpatterned surfaces 155.

According to an embodiment, the surface potential of the patterned surfaces 145 may be increased further by applying a surface treatment. According to embodiments, the surface treatment includes the application of a solution comprising one or more of deionized water, ethanol, acetone, $H_2SO_4$, $H_2NO_3$, or SDBS. After dielectric layer 201 has been patterned and a surface treatment has (optionally) been applied, a seed layer is formed over the surface of the dielectric layer 201. According to embodiments, the seed layer 130 is formed over the patterned surfaces 145 and unpatterned surfaces 155, as shown in FIG. 4B, by dipping the dielectric layer 201 into an ionic seeding solution.

According to an embodiment, an ionic solution may comprise a solution of $PdCl_2$ and HCl. The HCl ionizes the $PdCl_2$ to create $Pd^{+2}$ ions. The $Pd^{+2}$ ions adsorb to the patterned surfaces 145 and the unpatterned surfaces 155 of the dielectric layer 201. According to an embodiment, a reducing agent is applied to the surfaces of the dielectric layer 201 to reduce the $Pd^{+2}$ ions to an oxidation state of zero (i.e., $Pd^{(0)}$). By way of example, and not by way of limitation, the reducing agent is DMAB.

In an additional embodiment, an ionic seeding solution may include a two dip process. By way of example, the dielectric layer 201 may be dipped into a first seeding solution that includes $SnCl_2$ and then dipped into a second seeding solution that includes $PdCl_2$. In such embodiments, the Sn ions ($Sn^{+2}$) adsorb onto the surfaces of the dielectric layer 201. The second seeding solution includes $Pd^{+2}$ ions that are readily reduced to a zero oxidation state by the $Sn^{+2}$ ions, which are oxidized to $Sn^{+4}$. The $Pd^{(0)}$ replaces the $Sn^{+2}$ ions that were adsorbed to the surfaces of the dielectric layer 201, thereby producing a seed layer 130 comprising $Pd^{(0)}$.

Figure 4B:
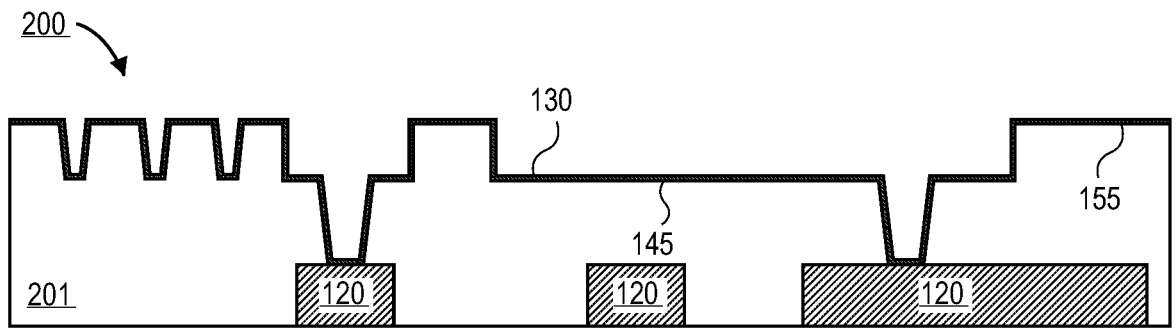

While the seed layer 130 is shown as a continuous layer in FIG. 4B, embodiments are not limited to such configurations. It is noted that the seed layer 130 does not need to be continuous in order to allow for subsequent metallization with an electroless process. As such, a seed layer 130 may include isolated metallic elements dispersed over the patterned surfaces 145. According to embodiments, the seed layer may have a thickness less than 10 Å. By way of example, and not by way of limitation, the seed layer may have a thickness equal to the thickness of a single atom of the metallic component.

Figure 4C:
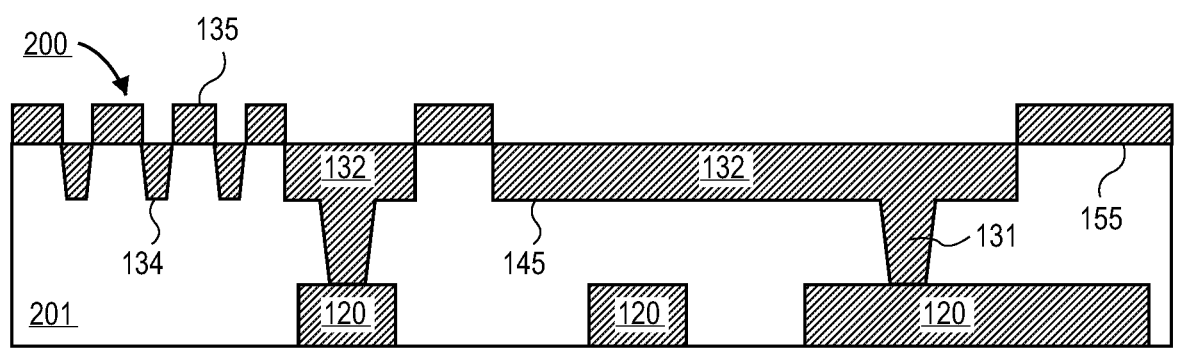

Referring now to FIG. 4C, the dielectric layer 201 is metallized with an electroless plating process. In an embodiment, the electroless plating process is a copper plating process. The bath used for the electroless plating process may be a solution comprising a source of metal ions, such as copper ions, and a reducing agent, such as formaldehyde or DMAB. The electroless plating solution may also comprise complexants, buffers, stabilizers, and accelerators, as is known in the art.

Figure 4D:
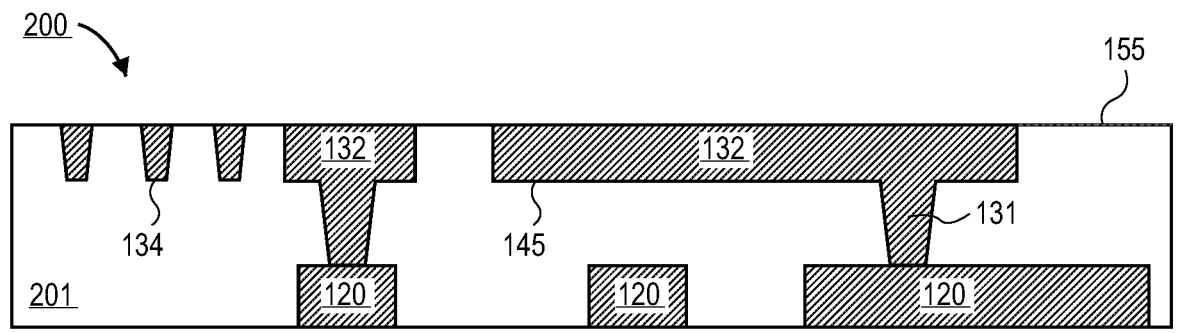

When the dielectric layer 201 having a seed layer 130 formed thereon is introduced into the solution a chemical reduction of metal occurs only on the portions of the dielectric layer 201 where the seed layer 130 is present. Since the seed layer 130 is formed over both the patterned surfaces 145 and the unpatterned surfaces 155, the plated metal will be deposited over the entire surface of the dielectric layer 201. As shown in FIG. 4C, excess metal 135 is formed over the unpatterned surfaces 155 due to the presence of the seed layer 130. However, the lower adhesion strength of the seed layer 130 formed over the unpatterned surfaces 155 allows for the excess metal 135 to be selectively removed. For example, the excess metal may be removed with a surface cleaning process such as ultra-sonic cleaning, washing with a high pressure water jet, or a combination of the two. Additional embodiments may include a cleaning process that includes washing the surface with one or more of acetone, NaOH, and $HNO_3$. After the cleaning process, the top surfaces of the contacts 132 and lines 134 may be substantially coplanar with the top of the unpatterned surfaces 155 of the dielectric layer 201, as shown in FIG. 4D.

In an embodiment, the cleaning process may be performed before the electroless plating is performed. In such embodiments, the seed layer 130 formed over the unpatterned surfaces 155 is removed in substantially the same manner described with respect to FIG. 3. Thereafter, an electroless plating process may be used to selectively metallize the patterned surfaces 145 of the dielectric layer 201 to produce a dielectric layer substantially similar to the one shown in FIG. 4D.

Figure 5:
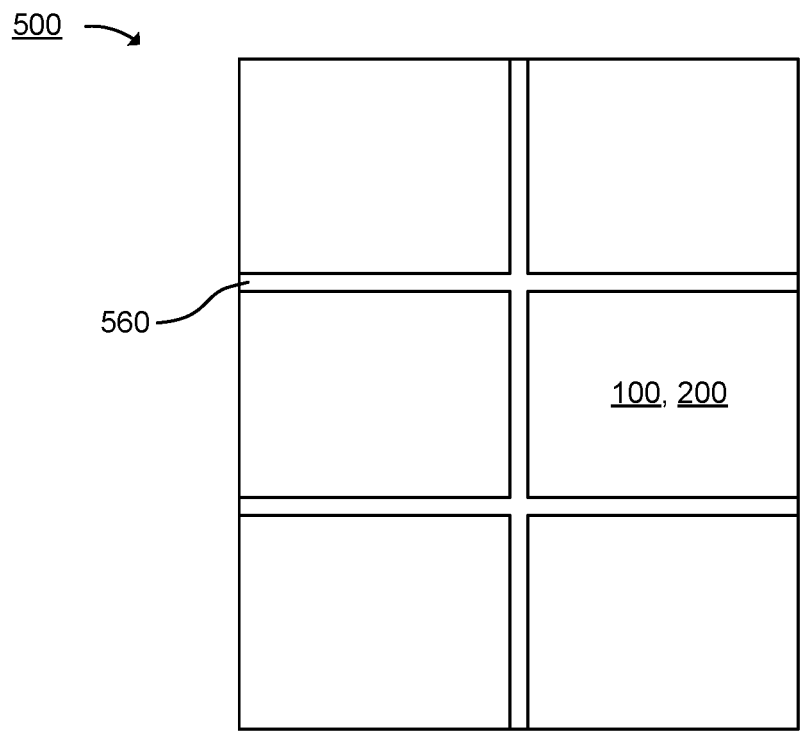
FIG. 5 illustrates an overhead view of a panel that includes multiple build-up structures according to an embodiment.

FIG. 5 is an overhead view of a panel 500 including multiple build-up structures 100 or 200. Each build-up structure 100 or 200 may include a plurality of dielectric layers 101, 201, formed in accordance with embodiments. Accordingly, a plurality of build-up structures may be manufactured simultaneously. As shown, each build-up structure 100 or 200 may be separated by scribe lines 560 to allow for singulation after the build-up structures 100 or 200 have been manufactured.

Figure 6:
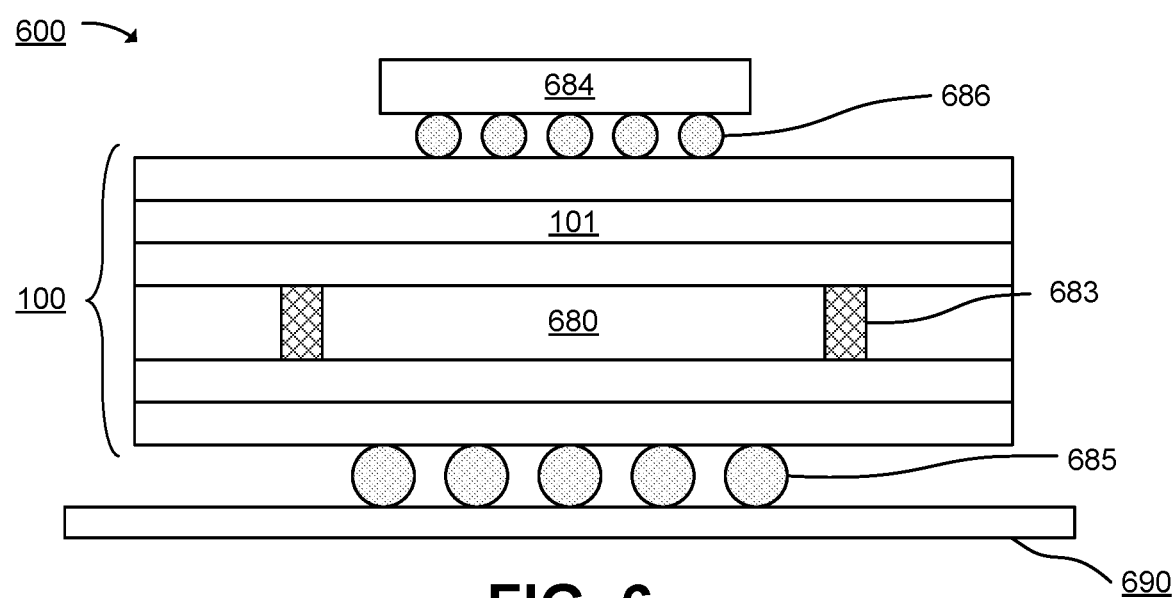
FIG. 6 illustrates a cross-sectional view of a device package that includes build-up structures according to an embodiment.

FIG. 6 shows a corresponding cross-sectional view of a package 600 that includes a build-up structure 100 or 200. According to an embodiment, the build-up structure 100 includes one or more dielectric layers 101 formed in accordance with embodiments. As such, each dielectric layer 101 may include electrical interconnects, such as contacts, conductive lines, and conductive vias, as described above. In an embodiment, the build-up structure 100 may include a core 680, although other embodiments may include a coreless design. The core 680 includes vias 683 that allow for electrical connections to be made through the build-up structure 100. As shown, a chip 684, such as a flip-chip, is connected to a build-up structure 100 with solder bumps 686. The lowermost dielectric layer 101 of the build-up structure 100 may be bonded to a board 690, such as a printed circuit board, with solder bumps 688.

Figure 7:
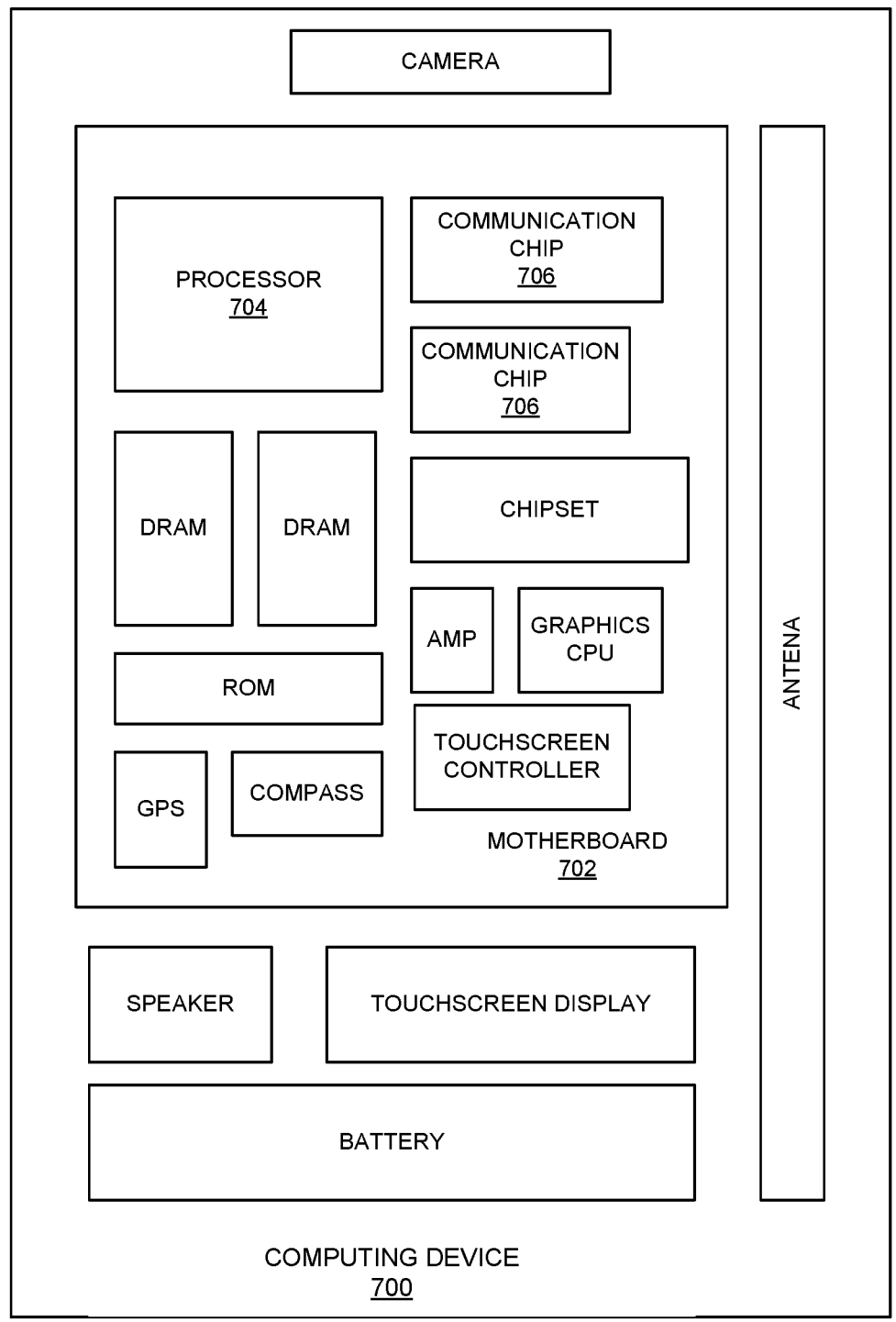
FIG. 7 illustrates a schematic diagram of a computing device that utilizes a device package having dielectric layers formed in accordance with in an embodiment.

FIG. 7 illustrates a computing device 700 in accordance with an embodiment. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations, the processor 704 is integrated into a package that includes one or more build-up structures that have dielectric layers that are selectively metalized in accordance with various embodiments. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another embodiment, the communication chip 706 may be integrated into a package that includes one or more build-up structures that have dielectric layers that are selectively metalized in accordance with various embodiments.

In further implementations, another component housed within the computing device 700 that may be integrated into a package that includes one or more build-up structures that have dielectric layers that are selectively metalized in accordance with various embodiments.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Embodiments include a method for metallizing a dielectric layer, comprising, patterning the dielectric layer to form one or more patterned surfaces on the dielectric layer, selectively forming a seed layer on the one or more patterned surfaces of the dielectric layer, and exposing the dielectric layer to an electroless plating bath comprising metal ions and a reducing agent, wherein the seed layer is a catalyst that allows the reducing agent to reduce the metal ions, thereby selectively depositing the metal ions on surfaces of the dielectric layer where the seed layer is formed. Additional embodiments include a method for metallizing a dielectric layer, wherein the dielectric layer is doped with an activator precursor and wherein forming the seed layer comprises a laser assisted local activation of the activator precursor on the one or more patterned surfaces of the dielectric layer. Additional embodiments include a method for metallizing a dielectric layer, wherein patterning the dielectric layer comprises a laser ablation process. Additional embodiments include a method for metallizing a dielectric layer, wherein the laser ablation and the laser assisted local activation of the activator precursor are performed at the same time. Additional embodiments include a method for metallizing a dielectric layer, wherein the activator precursor is chosen from $PdCl_2$, $PdSO_4$, $Pd(acac)_2$, Pd nano-particles, Ag nano-particles, Cu nano-particles, $AgCl_2$, or $RuCl_2$. Additional embodiments include a method for metallizing a dielectric layer, wherein a surface potential of the one or more patterned surfaces on the dielectric layer is higher than a surface potential of the unpatterned surfaces of the dielectric layer. Additional embodiments include a method for metallizing a dielectric layer, wherein forming the seed layer on the patterned surfaces of the dielectric layer comprises exposing the dielectric layer to a colloidal seeding solution wherein the seed layer is selectively deposited out of the seeding solution and onto the patterned surfaces of the dielectric layer. Additional embodiments include a method for metallizing a dielectric layer, further comprising, applying a surface treatment to the dielectric layer prior to exposing the dielectric layer to the seeding solution, wherein the surface treatment increases the difference in the surface potentials of the patterned surfaces and the unpatterned surfaces of the dielectric layer. Additional embodiments include a method for metallizing a dielectric layer, wherein the surface treatment comprises one or more of, deionized water, ethanol, acetone, $H_2SO_4$, $H_2NO_3$, or Na-dodecylbenzene sulfonate (SDBS). Additional embodiments include a method for metallizing a dielectric layer, wherein the colloidal seeding solution comprises a solution of $PdSO_4$ and $H_2SO_4$, or $SnCl_2$ and $PdCl_2$. Additional embodiments include a method for metallizing a dielectric layer, further comprising applying a surfactant to the surface of the dielectric layer. Additional embodiments include a method for metallizing a dielectric layer, further comprising applying a reducing agent to the surface of the dielectric layer subsequent to exposing the dielectric layer to the colloidal seeding solution, wherein the reducing agent reduces the seed layer to an oxidation state of zero. Additional embodiments include a method for metallizing a dielectric layer, further comprising cleaning the surface of the dielectric layer with an ultra-sonic cleaning process, a cleaning the surface of the dielectric layer with a high pressure water jet, or a combination of the ultra-sonic cleaning and high pressure water jet cleaning subsequent to exposing the dielectric layer to the colloidal seeding solution. Additional embodiments include a method for metallizing a dielectric layer, wherein forming the seed layer on the patterned surfaces of the dielectric layer comprises exposing the dielectric layer to an ionic seeding solution wherein the seed layer is selectively deposited out of the seeding solution and onto the surfaces of the dielectric layer. Additional embodiments include a method for metallizing a dielectric layer, wherein the ionic seeding solution comprises $PdCl_2$ and HCl, and further comprises applying a reducing agent to the surface of the dielectric layer subsequent to exposing the dielectric layer to the ionic seeding solution, wherein the reducing agent reduces the seed layer to an oxidation state of zero. Additional embodiments include a method for metallizing a dielectric layer, further comprising removing the seed layer from unpatterned surfaces of the dielectric layer by applying a cleaning solution comprising acetone or nitric acid.

Additional embodiments include a method for metallizing a dielectric layer, wherein the cleaning solution is applied after metalizing. Additional embodiments include a method for metallizing a dielectric layer, wherein the seed layer is a non-continuous layer. Additional embodiments include a method for metallizing a dielectric layer, wherein the dielectric layer is laminated or spun on over an existing layer.

Embodiments of the invention include a method for metallizing a dielectric layer, comprising, patterning the dielectric layer to form one or more patterned surfaces on the dielectric layer, wherein the patterning process increases the surface potential of the patterned surfaces such that it has a net positive charge, applying a surface treatment to the dielectric layer that further increases the surface potential of the patterned surfaces relative to unpatterned surfaces of the dielectric layer selectively forming a seed layer only on the one or more patterned surfaces of the dielectric layer by dipping the dielectric layer in a colloidal seeding solution, wherein the colloids are negatively charged and are deposited on the positively charged patterned surfaces, and exposing the dielectric layer to an electroless plating bath comprising metal ions and a reducing agent, wherein the seed layer is a catalyst that allows the reducing agent to reduce the metal ions, thereby depositing the metal ions on surfaces of the dielectric layer where the seed layer is formed. Additional embodiments include a method for metallizing a dielectric layer, wherein the surface treatment comprises one or more of, deionized water, ethanol, acetone, $H_2SO_4$, $H_2NO_3$, or Na-dodecylbenzene sulfonate (SDBS). Additional embodiments include a method for metallizing a dielectric layer, wherein the method further comprises cleaning the surface of the dielectric layer with ultra-sonic cleaning prior to exposing the dielectric layer to an electroless plating bath.

Embodiments of the invention include a dielectric layer comprising, a dielectric material formed over one or more first contacts, one or more patterned surfaces formed into the dielectric layer, wherein at least one of the patterned surfaces forms a via through the dielectric layer to expose a top surface of a first contact, and one or more second contacts formed only over the patterned surfaces of the dielectric layer and electrically coupled to first contacts by one or more of the conductive vias, wherein top surfaces of the second contacts are substantially coplanar with a top surface of the dielectric layer. Additional embodiments include a dielectric layer, wherein the dielectric material is doped with an activator precursor. Additional embodiments include a dielectric layer wherein the activator precursor is chosen from $PdCl_2$, $PdSO_4$, $Pd(acac)_2$, Pd nano-particles, Ag nano-particles, Cu nano-particles, $AgCl_2$, or $RuCl_2$.

Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A method for metallizing a dielectric layer, comprising:
patterning the dielectric layer to form one or more patterned surfaces on the dielectric layer, wherein the patterning process increases the surface potential of the patterned surfaces such that it has a net positive charge;
applying a surface treatment to the dielectric layer that further increases the surface potential of the patterned surfaces relative to unpatterned surfaces of the dielectric layer;
selectively forming a seed layer only on the one or more patterned surfaces of the dielectric layer by dipping the dielectric layer in a colloidal seeding solution, wherein the colloids are negatively charged and are deposited on the positively charged patterned surfaces; and
exposing the dielectric layer to an electroless plating bath comprising metal ions and a reducing agent, wherein the seed layer is a catalyst that allows the reducing agent to reduce the metal ions, thereby depositing the metal ions on surfaces of the dielectric layer where the seed layer is formed.

2. The method of claim 1, wherein the surface treatment comprises one or more of, deionized water, ethanol, acetone, $H_2SO_4$, $H_2NO_3$, or Na-dodecylbenzene sulfonate (SDBS).

3. The method of claim 1, wherein the surface treatment includes dipping the dielectric layer into a bath that includes the surface treatment solution.

4. The method of claim 1, wherein the surface treatment includes rinsing the surface treatment solution over the surface of the dielectric layer.

5. The method of claim 1, wherein the surface potential of the patterned surfaces of the dielectric layer is increased by 100% or more after the surface treatment.

6. The method of claim 1, wherein the patterned surfaces of the dielectric layer have a surface potential between approximately 4 V and 10 V, and wherein the unpatterned surfaces of the dielectric layer have a surface potential between approximately 1 V and 2 V.

7. The method of claim 1, wherein the method further comprises cleaning the surface of the dielectric layer with ultra-sonic cleaning prior to exposing the dielectric layer to an electroless plating bath.

8. The method of claim 1, wherein the seed layer is a non-continuous layer.

9. The method of claim 1, wherein the dielectric layer is laminated or spun on over an existing layer.

10. The method of claim 1, wherein the colloidal seeding solution includes a mixture of $SnCl_2$ and $PdCl_2$.

11. The method of claim 10, wherein the colloids have an average diameter between approximately 10 nm and 20 nm.

* * * * *